United States Patent
Cheon et al.

(10) Patent No.: US 7,741,893 B2
(45) Date of Patent: Jun. 22, 2010

(54) DUAL MODE CLOCK GENERATOR

(75) Inventors: Jeong In Cheon, Seoul (KR); Byoung Own Min, Gyunggi-do (KR); Chang Woo Ha, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 158 days.

(21) Appl. No.: 11/971,199

(22) Filed: Jan. 8, 2008

(65) Prior Publication Data

US 2008/0164925 A1  Jul. 10, 2008

(30) Foreign Application Priority Data

Jan. 9, 2007 (KR) .................... 10-2007-0002659

(51) Int. Cl.
*H03K 3/00* (2006.01)
(52) U.S. Cl. ..................................... 327/291
(58) Field of Classification Search .............. None
See application file for complete search history.

(56) References Cited

U.S. PATENT DOCUMENTS

| | | | | |
|---|---|---|---|---|
| 5,036,300 A | * | 7/1991 | Nicolai | 331/143 |
| 5,394,020 A | * | 2/1995 | Nienaber | 327/140 |
| 5,568,044 A | | 10/1996 | Bittner | |
| 5,912,593 A | * | 6/1999 | Susak et al. | 331/111 |
| 5,990,753 A | * | 11/1999 | Danstrom et al. | 331/143 |
| 6,107,851 A | * | 8/2000 | Balakirshnan et al. | 327/172 |
| 6,157,270 A | * | 12/2000 | Tso | 331/176 |
| 6,603,366 B2 | * | 8/2003 | Huang et al. | 331/111 |
| 7,005,933 B1 | | 2/2006 | Shutt | |
| 7,061,296 B2 | * | 6/2006 | Friedrich et al. | 327/299 |
| 7,138,880 B2 | * | 11/2006 | Ma et al. | 331/143 |
| 7,268,639 B2 | * | 9/2007 | Matsushita | 332/109 |
| 7,420,431 B2 | * | 9/2008 | Hwang et al. | 331/143 |
| 7,557,622 B2 | * | 7/2009 | Stanley | 327/131 |
| 2009/0141521 A1 | * | 6/2009 | Yang | 363/49 |

* cited by examiner

*Primary Examiner*—Lincoln Donovan
*Assistant Examiner*—Thomas J Hiltunen
(74) *Attorney, Agent, or Firm*—Lowe Hauptman Ham & Berner LLP

(57) ABSTRACT

There is a provided a dual mode clock generator that is applicable to a direct current-direct current converter of a power supply. The dual mode clock generator includes a frequency controller for controlling generation of charge and discharge; a current source unit for generating a charge, and generating a charge; a capacitor for charging a voltage according to the charge current generated by the current source unit; an oscillation controller for controlling switch-on or switch-off to charge and discharge the capacitor; a switch for controlling the charging and discharging of the capacitor through the ON or OFF control of the oscillation controller; and a current sink unit for generating a discharge current according to the second current in the first operation mode and generating a discharge current according to the third current and the fourth current in the second operation mode.

12 Claims, 10 Drawing Sheets

DUAL MODE CLOCK GENERATOR

CROSS-REFERENCE TO RELATED APPLICATIONS

This application claims the priority of Korean Patent Application No. 2007-02659 filed on Jan. 9, 2007, in the Korean Intellectual Property Office, the disclosure of which is incorporated herein by reference.

BACKGROUND OF THE INVENTION

1. Field of the Invention

The present invention relates to a dual mode clock generator that is applicable to a direct current-direct current (DC-CD) converter of a power supply, and more particularly, to a dual mode clock generator capable of generating a suitable clock signal for an operation mode that is selected in response to selection of an active clamp forward mode and an LLC resonant half bridge mode.

2. Description of the Related Art

In general, a switching-mode power supply (SMPS) is a stabilized power supply system for converting a DC input voltage into a voltage of a square waveform using a semiconductor element, such as a power MOSFET, as a switch, to thereby obtain a DC output voltage that is controlled through a filter, wherein the stabilized power supply system has high durability and is suitably manufactured in a small and lightweight scale by controlling the flow of electric power using a switching processor of a semiconductor element.

Among these SMPS, there are several operation modes: an active clamp forward (hereinafter, referred to as ACF) mode belonging to a half bridge type; and a LLC resonant half bridge (hereinafter, referred to as LLC) mode that has attracted public attention lately, depending on the switching control system. Therefore, dedicated control devices have been developed to control each of these converters so that a plurality of dedicated ICs can drive power MOSFET in the SMPS.

For example, the ACF DC-DC converter may be considered to be one of the half bridge converters since it uses two active switches, and it has been known that power conversion capacity of the ACF DC-DC converter comes to 500 W as high as possible. This ACF DC-DC converter may be used to reduce switching loss since it operates in a soft switching mode, and to enhance its reliability by reducing voltage stress of a switch.

And, the LLC converter may be designed to be suitable for middle/large capacity power supply system since the LLC converter is basically used for a half bridge circuit, and is referred to as a power supply system that actually used to apply to 500 W or more converters and has been studied actively. Also, the LLC converter is one of the circuit systems that basically function to reduce their switching loss and conduction loss, thereby to enhance power conversion efficiency, since the LLC converter is driven in a resonance mode.

This SMPS needs a feedback control circuit to stabilize an output voltage. Here, representative examples of the feedback control circuit include a pulse width modulation (PWM) control circuit and a pulse frequency modulation (PFM) control circuit. In general, the PWM control circuit using a pulse width modulation is used in the ACF DC-DC converter, the PFM control circuit using a pulse frequency modulation is used in the LLC converter, and respective dedicated control devices are required for controlling each of the DC-DC converters.

Hereinafter, a conventional control system of the DC-DC converter will be described in detail.

Conventional SMPS is a device that converts energy by using energy storage devices such as an inductor, a transformer, a capacitor or the like. The SMPS includes a boost-up or step-up mode for converting a low input voltage to a high voltage, a step-down mode for converting a high input voltage to a low voltage, and an inverting mode for simply reversing its own polarity, etc.

Here, the DC-DC converter is a circuit that receives a DC input voltage to obtain a constant DC output voltage by suitably feeding back to the switching regulator, and it has a disadvantages that noises and ripples may be caused in the DC output voltage since the circuit transmits energy in a discontinuous packet manner every time.

These noises and ripples may be reduced by selecting suitable parts such as an inductor, a capacitor, etc. and employing suitable control methods. In this case, the conventional control methods include a pulse frequency modulation (PFM) and a pulse width modulation (PWM), as described above.

The conventional ACF DC-DC converter uses a PWM control circuit to generate a constant output voltage by generating a pulse signal whose duty is changed according to a voltage fed back from an output voltage, a reference voltage and a pulse signal waveform of an oscillator, and controlling a transistor as a switch.

In this case, the PWM control circuit may maintain a constant output voltage by increasing a pulse width when the PWM control circuit has a high load.

A clamp circuit in the DC-DC converter functions to reset a transformer, clamp a voltage of a switch, and enable zero-voltage switching (ZVS) of subsidiary and main switches to be performed.

The conventional LLC converter uses a PFM control circuit to generate a constant output voltage by turning on/off a transistor as a switch using a pulse signal of an oscillator having a fixed frequency and a constant duty, a voltage fed back from an output voltage and a reference voltage.

In this case, the PFM control circuit may maintain a constant pulse width when the PWM control circuit has a low load, and maintain a constant output voltage by continuously controlling a pulse frequency to be reduced.

The DC-DC converter has advantages that it has excellent system efficiency, and secures zero-voltage switching over the entire load range due to the high magnetizing current. And, a gate signal applied to the MOSFET switch is complementary in the LLC converter, and has a duty ratio of 50%, and the control of variable operating frequency is used to adjust an output voltage.

Accordingly, it has been known that the conventional ACF DC-DC converter operates unstably under a low load condition, and the conventional ACF DC-DC converter has been recommended to be used under a heavy load condition.

Also, it has been known that the conventional LLC converter operates unstably under a heavy load condition, and the conventional LLC converter has been recommended to be used under a low load condition.

However, each of the conventional DC-DC converters has a problem that it is impossible to apply one dedicated device to both of the ACF DC-DC converter and the LLC converter since the conventional DC-DC converters need their own dedicated control devices.

That is, it has been proposed that the dedicated control circuit that controls each of the conventional power systems operates in a PWM mode when the dedicated control circuit is subject to the heavy load, and operates in a PFM mode when the dedicated control circuit is subject to a low load. However, one problem is that the ACF DC-DC converter and the LLC converter may not be supported by the one control device.

Therefore, there has been a demand for one control circuit that can selectively support the ACF or LLC operation mode, and one clock generator that is suitable for use of the two ACF and LLC modes remains to be required for supporting both of the ACF modes and the LLC mode.

SUMMARY OF THE INVENTION

An aspect of the present invention provides a dual mode clock generator capable of generating a suitable clock signal for an operation mode that is selected in response to selection of an active clamp forward mode and an LLC resonant half bridge mode.

According to an aspect of the present invention, there is provided a dual mode clock generator including a frequency controller for controlling generation of charge and discharge currents according to first and second currents in a first operation mode and recognizing an initial state and a normal state according to a soft start signal to control generation of charge and discharge currents according to a third current or a fourth current in a second operation mode; a current source unit for generating a charge current according the first current in the first operation mode and generating a charge current according to the third current or the fourth current in the second operation mode depending on an initial state and a normal state through the control of the frequency controller; a capacitor for charging a voltage according to the charge current generated by the current source unit; an oscillation controller for controlling switch-on or switch-off to maintain a charge voltage of the capacitor between the predetermined highest reference voltage and the predetermined lowest reference voltage; a switch coupled between a ground and a connection node formed between the current source unit and the capacitor, and controlling charging and discharging of the capacitor by performing an on/off operation through the ON or OFF control of the oscillation controller; and a current sink unit coupled between the switch and the ground to generate a discharge current according to the second current in the first operation mode and generate a discharge current according to the third current and the fourth current in the second operation mode depending on an initial state and a normal state, and to discharge a charge voltage of the capacitor using the discharge currents through the control of the frequency controller.

The frequency controller may control generation of charging and discharging currents on the basis of the third current when a soft start signal is proven to be in an initial state in the second operation mode, and control generation of charging and discharging currents on the basis of the fourth current when the soft start signal is proven to be in a normal state in the second operation mode.

The current source unit may generate a charge current according to the third current when the current source is in an initial state in the second operation mode, and generate a charge current according to the fourth current when the current source is in a normal state in the second operation mode.

The oscillation controller may control an ON state of the switch when the charge voltage of the capacitor is higher than predetermined highest reference voltage, and control an OFF state of the switch when the charge voltage of the capacitor is lower than the lowest reference voltage that is set to a lower value than the highest reference voltage.

The current sink unit may generate a discharge current according to the third current when it is in an initial state in the second operation mode and generate a discharge current according to the fourth current when it is in a normal state in the second operation mode, and discharge a charge voltage of the capacitor using the discharge currents.

The first operation mode may be an ACF mode corresponding to an active clamp forward mode belonging to a half bridge type.

The second operation mode may be an LLC mode corresponding to an LLC resonant half bridge.

The frequency controller may include a mode decision unit for determining whether an operation mode is a first operation mode or a second operation mode according to a mode selection signal; and a charging/discharging current controller for controlling generation of charging and discharging currents according to the first and second currents when the operation mode is proven to be a first operation mode by the mode decision unit, and controlling generation of charging and discharging currents on the basis of the third current when a soft start signal is proven to be in an initial state in the second operation mode by the mode decision unit, and controlling generation of charging and discharging currents on the basis of the fourth current when the soft start signal is proven to a normal state.

The first current may be a predetermined current that is used to charge the capacitor in the first operation mode, and the second current may be a predetermined current that is used to discharge the capacitor in the first operation mode.

The third current may be a predetermined current that is used to charge and discharge the capacitor in an initial state in the second operation mode, and the fourth current may be a feed-back current from a load that is used to charge and discharge the capacitor in a normal state in the second operation mode.

The oscillation controller may include a first comparator including a reverting terminal for receiving a charge voltage of the capacitor, a non-reverting terminal for receiving the highest reference voltage and an output terminal for comparing the charge voltage with the highest reference voltage and outputting a signal corresponding to the comparison value; a second comparator including a reverting terminal for receiving the charge voltage, a non-reverting terminal for receiving the lowest reference voltage, and an output terminal for comparing the charge voltage with the lowest reference voltage and outputting a signal corresponding to the comparison value; and a RS latch including a set terminal for receiving an output signal of the first comparator and a reset terminal for receiving an output signal of the second comparator, and outputting an OFF signal to the switch when the output signal of the first comparator is in a low level and outputting an ON signal to the switch when the output signal of the second comparator is in a high level.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
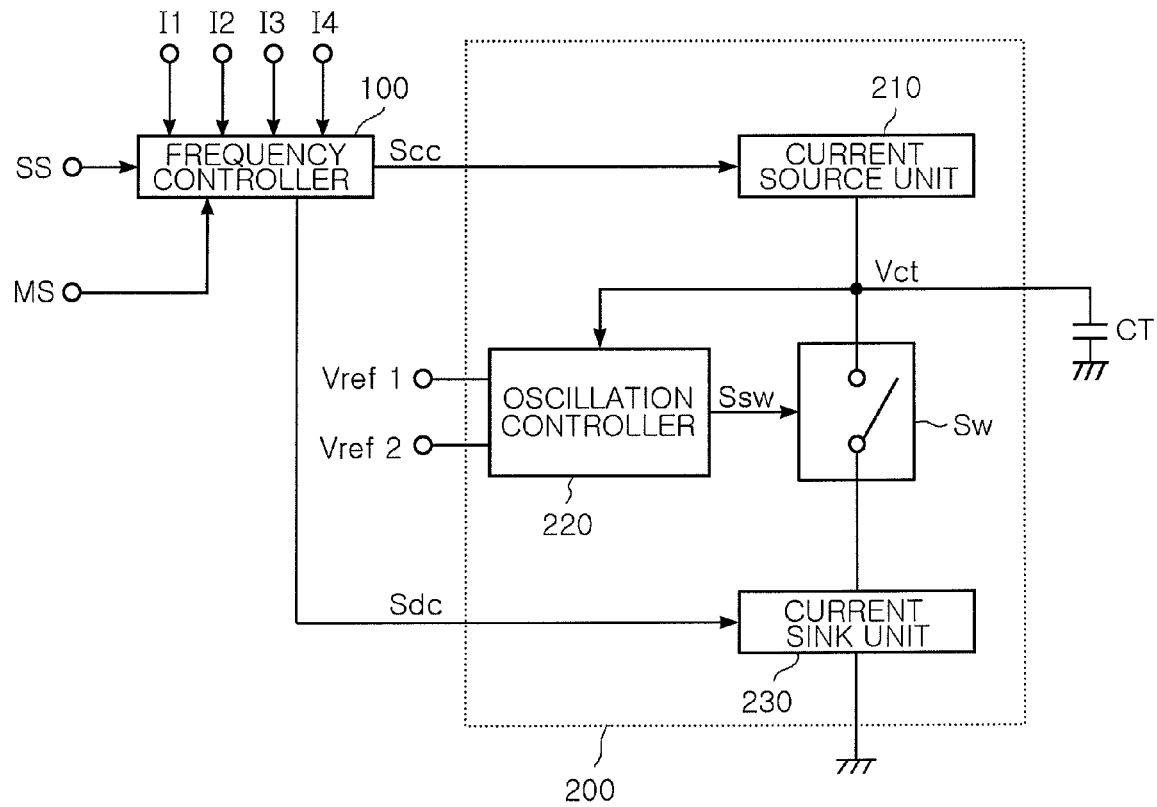
FIG. 1 is a block view illustrating a dual mode clock generator according to one exemplary embodiment of the present invention.

Exemplary embodiments of the present invention will now be described in detail with reference to the accompanying drawings.

However, the description proposed herein is just a preferable example for the purpose of illustrations only, not intended to limit the scope of the invention, so it should be understood that other equivalents and modifications could be made thereto without departing from the spirit and scope of the invention. It is considered that parts having the same configuration and functions have substantially the same reference numerals in the accompanying drawings of the present invention.

FIG. 1 is a block view illustrating a dual mode clock generator according to one exemplary embodiment of the present invention.

Referring to FIG. 1, the dual mode clock generator according to one exemplary embodiment of the present invention includes a frequency controller 100 for controlling generation of charge and discharge currents according to first and second currents I1 and I2 in a first operation mode and recognizing an initial state and a normal state according to a soft start signal SS to control generation of charge and discharge currents according to a third current I3 or a fourth current I4 in a second operation mode; a current source unit 210 for generating a charge current according the first current in the first operation mode and generating a charge current in the second operation mode according to the third current or the fourth current depending on an initial state and a normal state through the control of the frequency controller 100; a capacitor CT for charging a voltage according to the charge current generated by the current source unit 210; an oscillation controller 220 for controlling switch-on or switch-off to maintain a charge voltage Vct of the capacitor CT between the predetermined highest reference voltage Vref1 and the predetermined lowest reference voltage Vref2; a switch SW coupled between a ground and a connection node formed between the current source unit 210 and the capacitor CT, and controlling charging and discharging of the capacitor CT by performing an on/off operation through the ON or OFF control of the oscillation controller 220; and a current sink unit 230 coupled between the switch SW and the ground of the capacitor CT to generate a discharge current according to the second current I2 in the first operation mode and generate a discharge current according to the third current I3 and the fourth current I4 in the second operation mode depending on an initial state and a normal state, and to discharge a charge voltage Vct of the capacitor CT using the discharge currents through the control of the frequency controller 100.

Also, the frequency controller 100 controls generation of charging and discharging currents on the basis of the third current I3 when a soft start signal SS is proven to be in an initial state in the second operation mode, and controls generation of charging and discharging currents on the basis of the fourth current I4 when the soft start signal SS is proven to be in a normal state in the second operation mode The current source unit 210 generates a charge current according to the third current I3 when the current source is in an initial state in the second operation mode, and generates a charge current according to the fourth current I4 when the current source is in a normal state in the second operation mode.

The oscillation controller 220 controls an ON state of the switch SW when the charge voltage Vct of the capacitor CT is higher than predetermined highest reference voltage Vref1, and controls an OFF state of the switch SW when the charge voltage Vct of the capacitor CT is lower than the lowest reference voltage Vref2 that is set to a lower value than the highest reference voltage Vref1.

The current sink unit 230 generates a discharge current according to the third current I3 when it is in an initial state in the second operation mode and generates a discharge current according to the fourth current I4 when it is in a normal state in the second operation mode, and discharges a charge voltage Vct of the capacitor CT using the discharge currents.

In this case, for the dual mode clock generator according to one exemplary embodiment of the present invention, the first operation mode may be an ACF mode corresponding to an active clamp forward mode belonging to a half bridge type, and the second operation mode may be an LLC mode corresponding to an LLC resonant half bridge.

And, the first current I1 may be a predetermined current that is used to charge the capacitor in the first operation mode, the second current I2 may be a predetermined current that is used to discharge the capacitor in the first operation mode, the third current I3 may be a predetermined current that is used to charge and discharge the capacitor in an initial state in the second operation mode, and the fourth current I4 may be a feed-back current from a load that is used to charge and discharge the capacitor in a normal state in the second operation mode.

Figure 2:
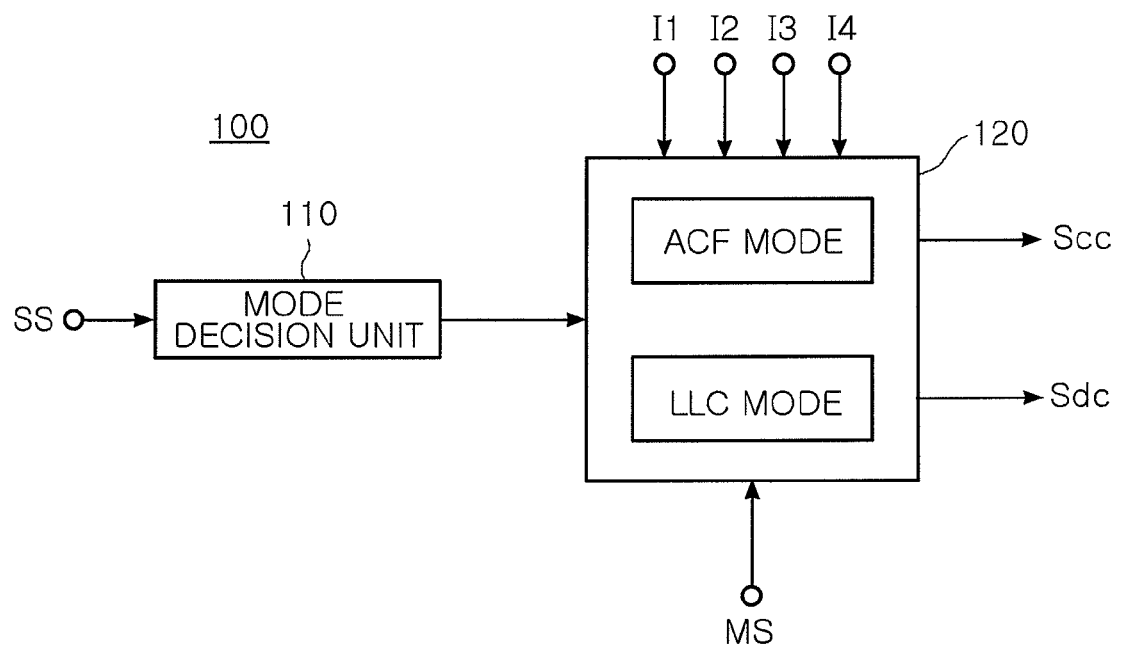
FIG. 2 is a block view illustrating a frequency controller as shown in FIG. 1.

FIG. 2 is a block view illustrating a frequency controller as shown in FIG. 1.

Referring to FIG. 2, the frequency controller 100 includes a mode decision unit 110 for determining whether an operation mode is a first operation mode or a second operation mode according to a mode selection signal; and a charging/discharging current controller 120 for controlling generation of charging and discharging currents according to the first and second currents when the operation mode is proven to be a first operation mode by the mode decision unit 110, and controlling generation of charging and discharging currents on the basis of the third current when a soft start signal SS is proven to be in an initial state in the second operation mode by the mode decision unit 110, and controlling generation of charging and discharging currents on the basis of the fourth current when the soft start signal SS is proven to a normal state.

Figure 3:
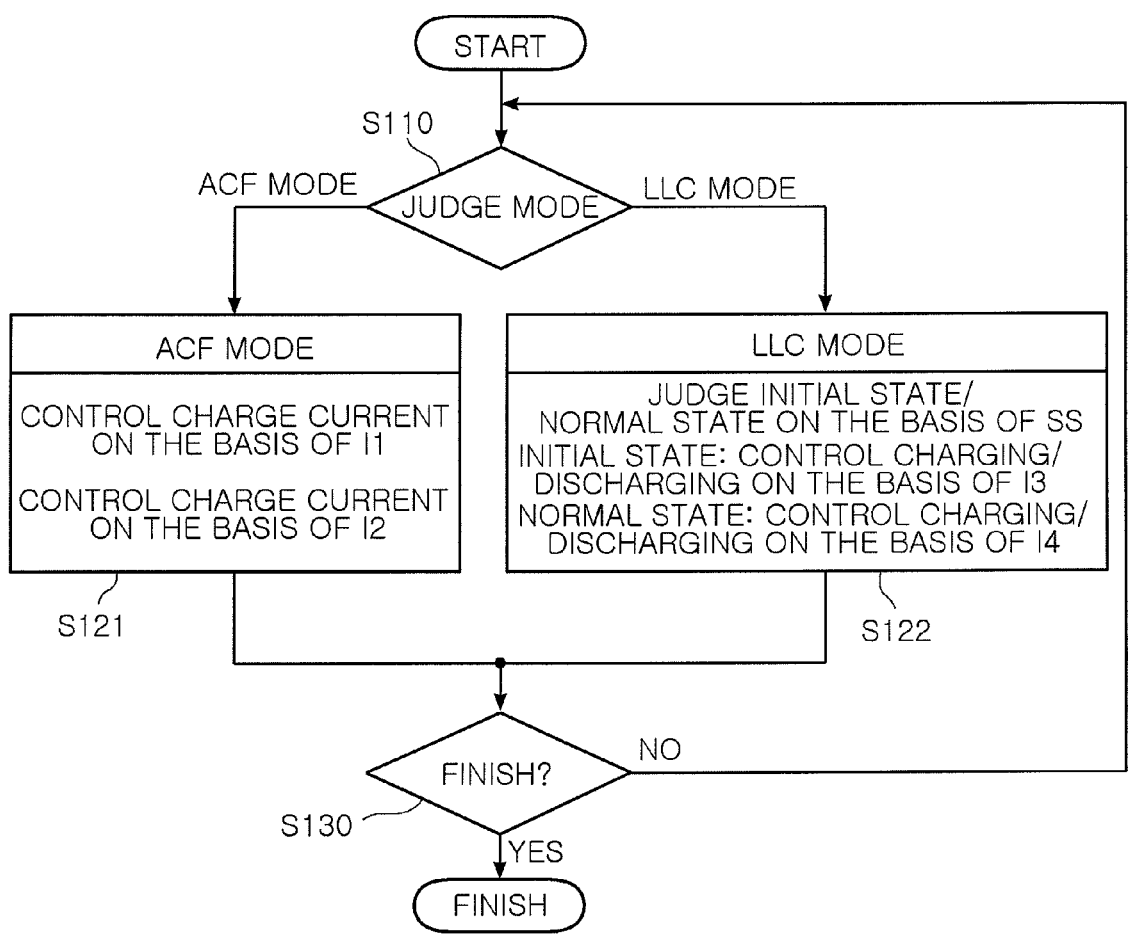
FIG. 3 is a flowchart illustrating the frequency controller as shown in FIG. 2.

FIG. 3 is a flowchart illustrating the frequency controller as shown in FIG. 2.

In FIG. 3, S110 is an operation of determining whether an operation mode is a first operation mode or a second operation mode. S121 is an operation of controlling generation of charging and discharging currents according to the first and second currents I1 and I2 when the operation mode is the first operation mode (e.g., an ACF mode). S122 is an operation of recognizing an initial state and a normal state to control generation of charging and discharging currents according to the third and fourth currents I3 and I4 when the operation mode is the second operation mode (e.g., an LLC mode). And, S130 is an operation of determining whether this process is finished or not, and proceeding to the S110 when the process is not finished and proceeding to FINISH when the process is finished.

Figure 4:
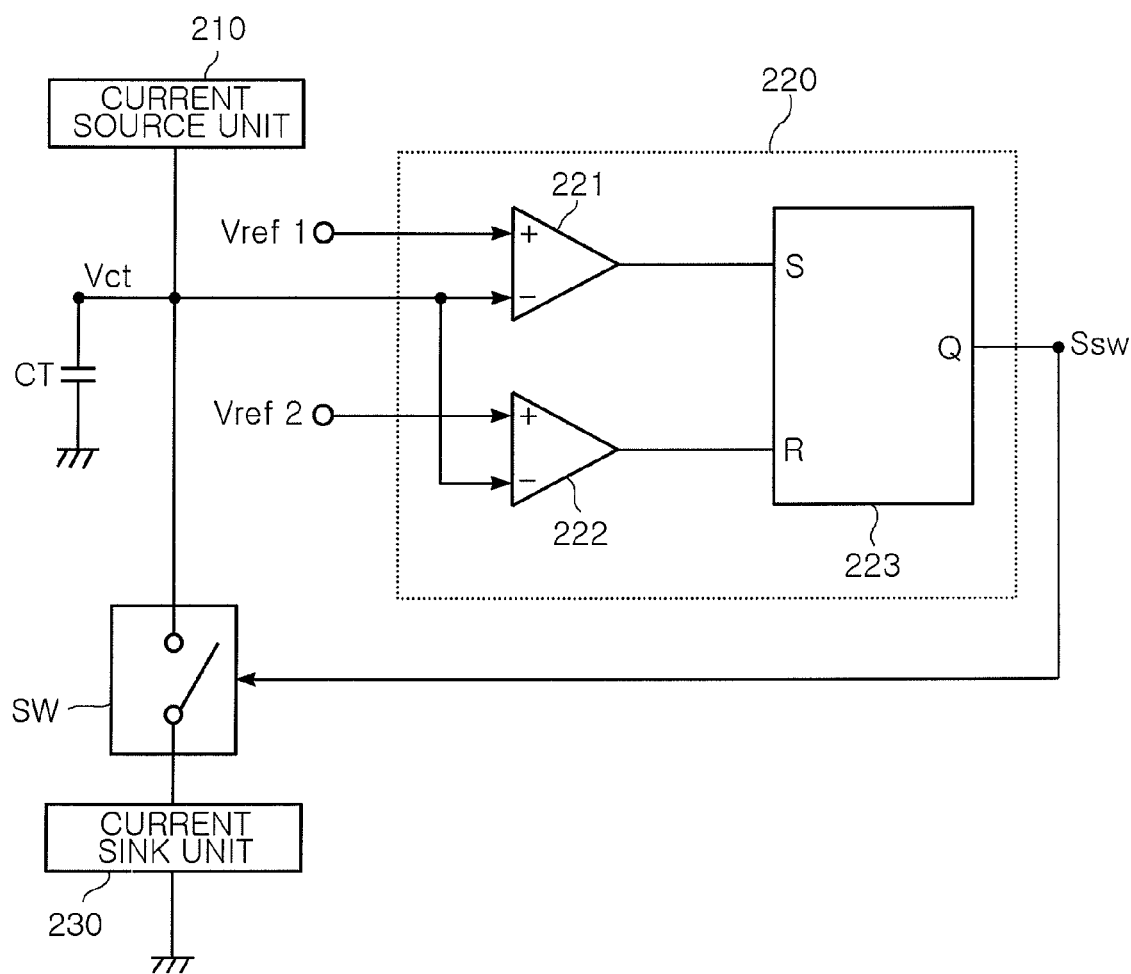
FIG. 4 is a block view illustrating an oscillation controller as shown in FIG. 1.

FIG. 4 is a block view illustrating an oscillation controller as shown in FIG. 1.

Referring to FIG. 4, the oscillation controller 220 includes a first comparator 221 including a reverting terminal for receiving a charge voltage Vct of the capacitor CT, a non-reverting terminal for receiving the highest reference voltage Vref1 and an output terminal for comparing the charge voltage Vct with the highest reference voltage Vref1 and outputting a signal corresponding to the comparison value; a second comparator 222 including a reverting terminal for receiving the charge voltage Vct, a non-reverting terminal for receiving the lowest reference voltage Vref2, and an output terminal for comparing the charge voltage Vct with the lowest reference voltage Vref2 and outputting a signal corresponding to the comparison value; and a RS latch 223 including a set terminal for receiving an output signal of the first comparator 221 and a reset terminal for receiving an output signal of the second comparator 222, and outputting an OFF signal to the switch SW when the output signal of the first comparator 221 is in a low level and outputting an ON signal to the switch SW when the output signal of the second comparator 222 is in a high level.

Figure 5:
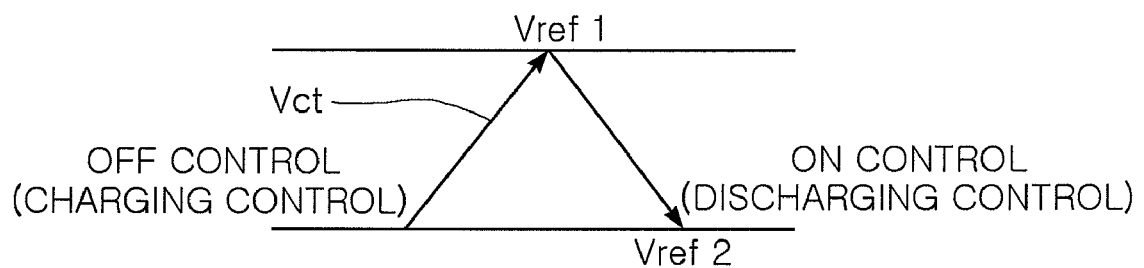
FIG. 5 is a waveform view illustrating a voltage Vct of a capacitor in an operation of the oscillation controller as shown in FIG. 4.

FIG. 5 is a waveform view illustrating a charge voltage Vct of a capacitor in an operation of the oscillation controller as shown in FIG. 4.

In FIG. 5, Vref1 is a first reference voltage, Vref2 is a second reference voltage, and Vct is a charge voltage of the capacitor CT. In this case, the charge voltage Vct is increased form the first reference voltage Vref1 toward the second reference voltage Vref2 by the current source unit 210 when the switch SW is in an OFF state, and the charge voltage Vct is decreased from the second reference voltage Vref2 toward the first reference voltage Vref1 by the current sink unit 230 when the switch SW is in an ON state.

Figure 6:
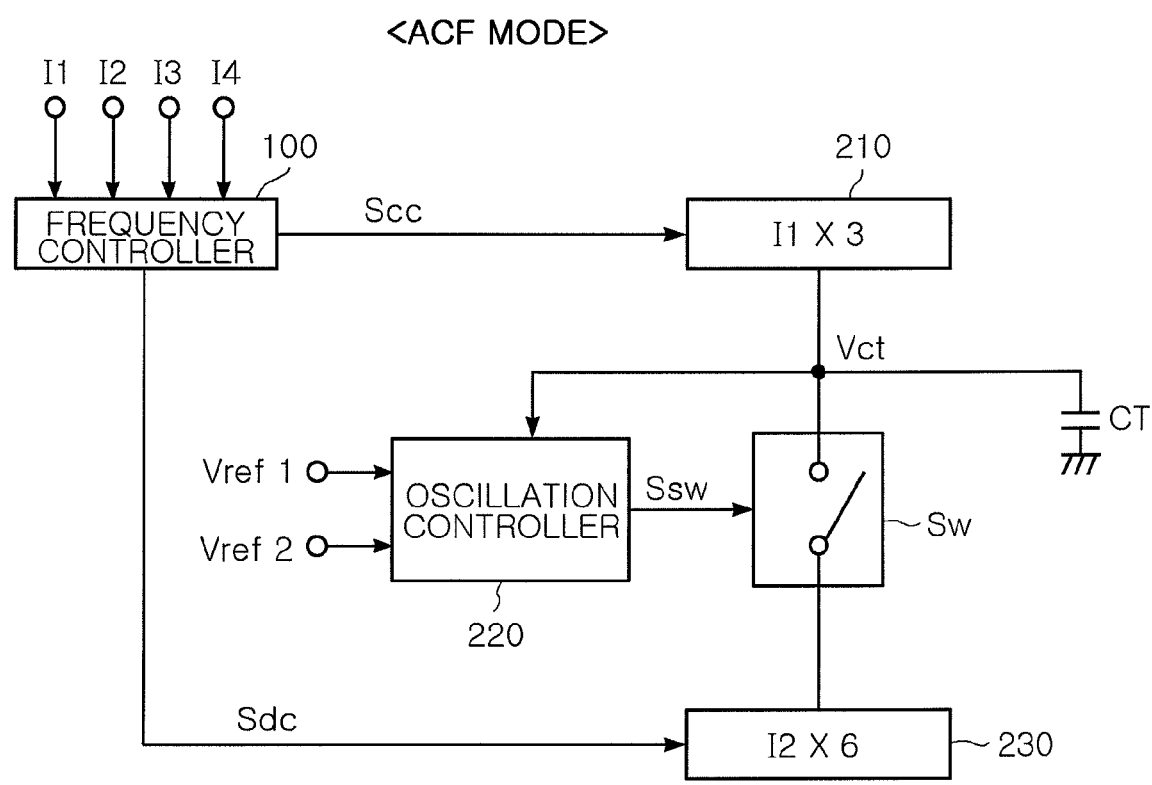
FIG. 6 is an equivalent block view illustrating an ACF mode of the dual mode clock generator as shown in FIG. 1.

FIG. 6 is an equivalent block view illustrating an ACF mode of the dual mode clock generator as shown in FIG. 1. In FIG. 6, the charging and discharging of the capacitor CT is controlled according to the predetermined constant first and second currents I1 and I2 by controlling a switch according to the first and second reference voltages Vref1 and Vref2 and the charge voltage Vct of the capacitor CT. Therefore, a clock signal having a constant fixed frequency is generated, as shown in FIG. 7.

Figure 7:
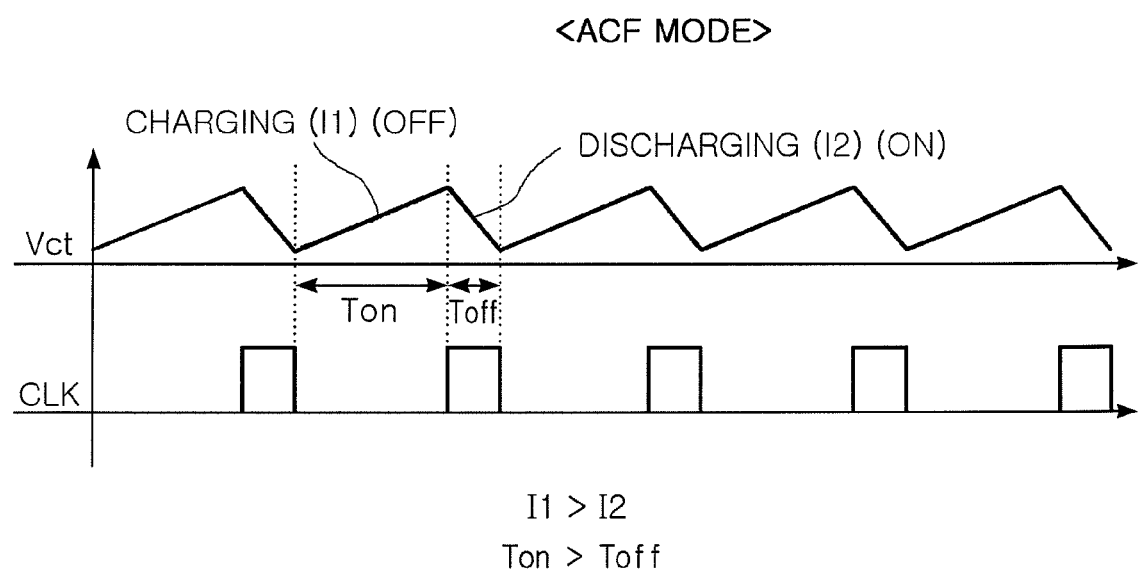
FIG. 7 is a timing chart illustrating main signals as shown in FIG. 6.

FIG. 7 is a timing chart illustrating main signals as shown in FIG. 6.

In FIG. 7, Vct is a charge voltage that is finally charged in the capacitor CT through the charging and discharging of the capacitor CT. CLK is a clock signal that is generated according to the charge voltage Vct.

Figure 8A:
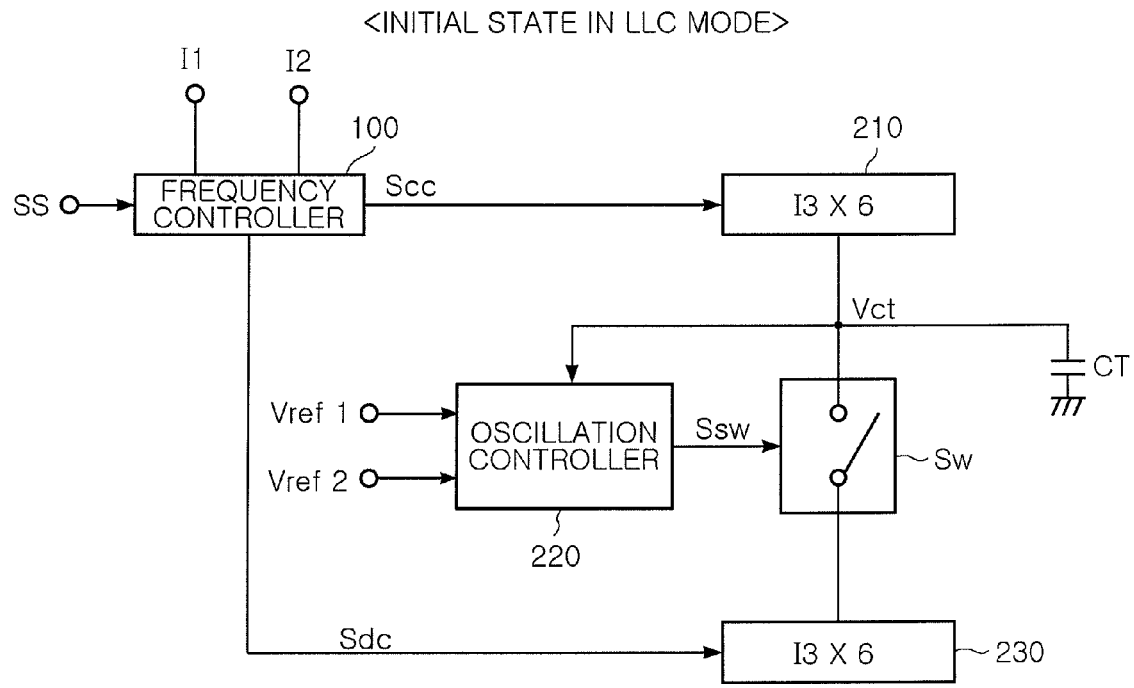
FIGS. 8 (a) and (b) are equivalent block views illustrating an initial state and a normal state of an LLC mode in the dual mode clock generator as shown in FIG. 1.
Figure 8B:
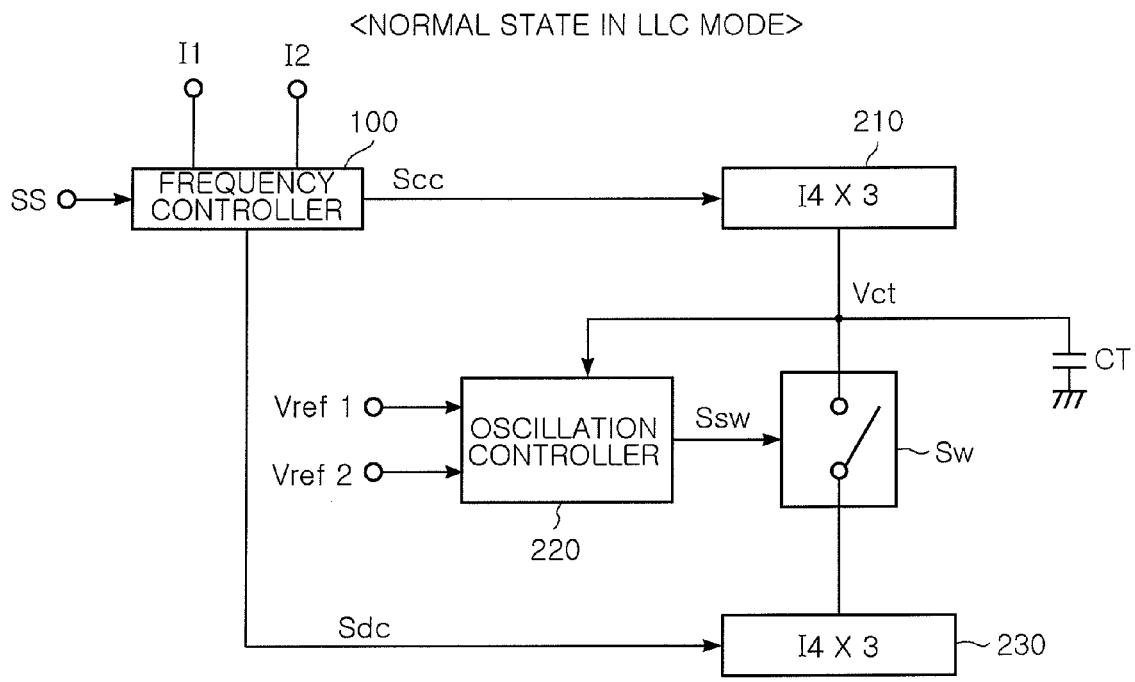

FIGS. 8 (a) and (b) are equivalent block views illustrating an initial state and a normal state of an LLC mode in the dual mode clock generator as shown in FIG. 1.

In FIG. 8, the charging and discharging of the capacitor CT is controlled according to the predetermined third current I3 and the fourth currents I4 corresponding to feed-back currents that are changed by the changes in load by controlling a switch according to the soft start signal SS, the first and second reference voltages Vref1 and Vref2 and the charge voltage Vct of the capacitor CT. Therefore, a clock signal having a gradually decreasing frequency in an initial state and a clock signal having a constant frequency in a normal state are generated, as shown in FIG. 9.

Figure 9:
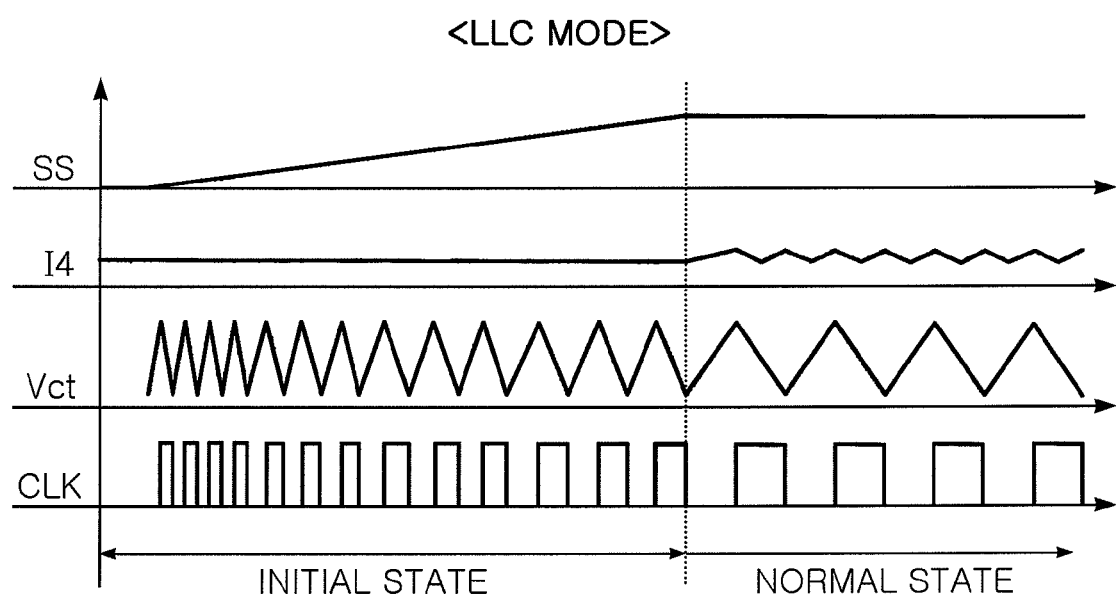
FIG. 9 is a timing chart illustrating main signals as shown in FIG. 8.

FIG. 9 is a timing chart illustrating main signals as shown in FIG. 8.

In FIG. 9, SS is a soft start signal, I4 is a fourth current corresponding to a feed-back current, and Vct is a charge voltage that is finally charged in the capacitor CT through the charging and discharging of the capacitor CT. CLK is a clock signal that is generated according to the charge voltage Vct.

Figure 10:
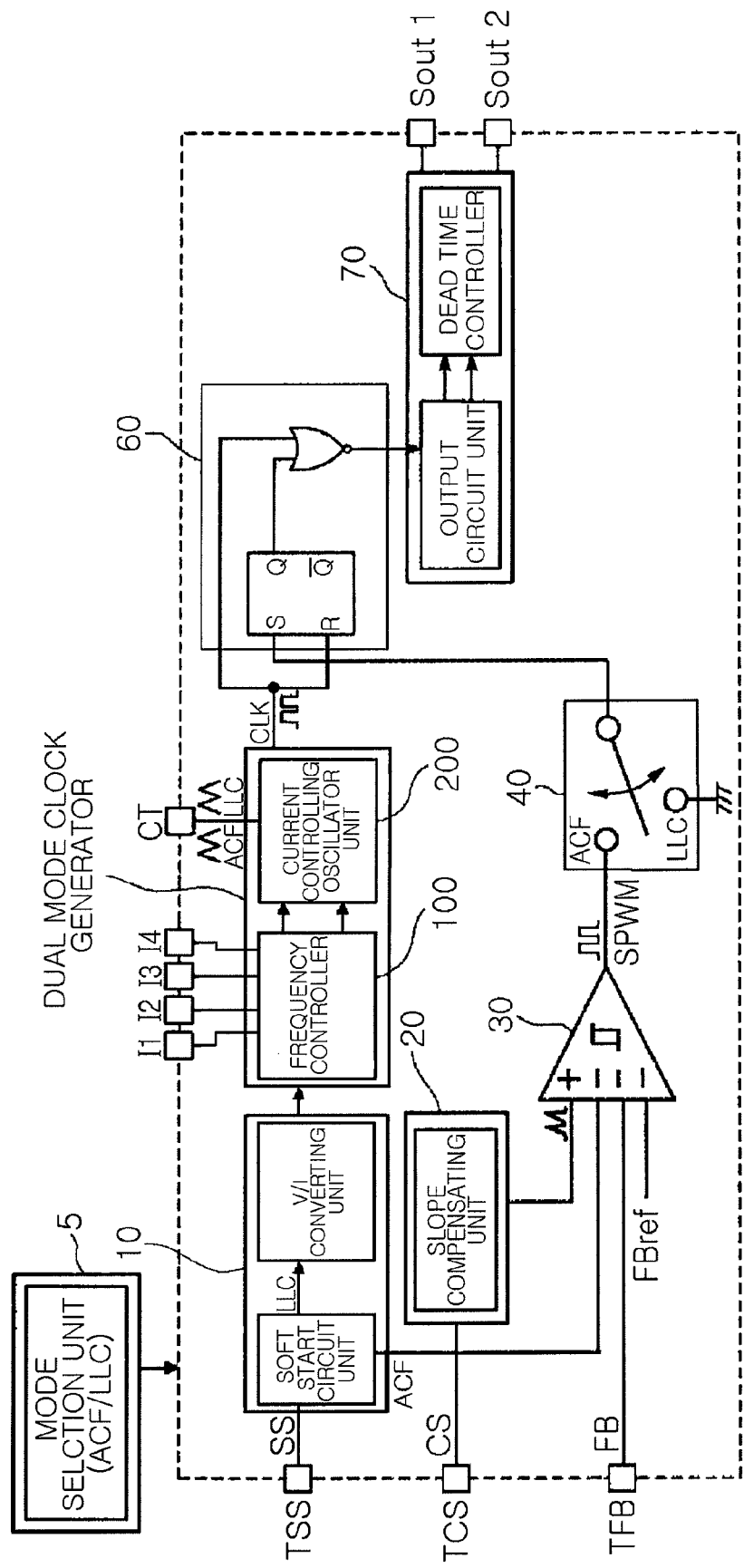
FIG. 10 is an illustrative view illustrating a system using the dual mode clock generator as shown in FIG. 1.

FIG. 10 is an illustrative view illustrating a system using the dual mode clock generator as shown in FIG. 1.

In FIG. 10, the system using the dual mode clock generator includes a mode selection unit 5 for selecting an ACF operation mode or an LLC operation mode; a soft start unit 10 for generating soft start signals SS in the ACF operation mode and the LLC operation mode; PWM comparator unit 30 for comparing the current detection signal CS, the feedback signal FB, the feedback reference signal FBref and the soft start signal SS when the ACF operation mode is selected in the mode selection unit 5 and generating a PWM signal SPWM corresponding to the comparison value; a selection unit 40 for selecting a PWM signal of the PWM comparator unit 30 when the ACF operation mode is selected in the mode selection unit 5; a clock generator for generating a clock signal having a predetermined fixed frequency when the ACF operation mode is selected by the mode selection unit 5 and generating the soft start signal SS and a clock signal having a frequency according to the operation current when the LLC operation mode is selected by the mode selection unit 5; and a latch unit 60 for maintaining the PWM signal according to the clock signal of the clock generator using the selection unit 40 when the ACF operation mode is selected in the mode selection unit 5 and maintaining the clock signal of the clock generator when the LLC operation mode is selected in the mode selection unit 5.

The control circuit of the DC-CD converter may include a slope compensating unit 20 for compensating for a slope of a current detection signal when the ACF operation mode is selected in the mode selection unit 5; and an output driver 70 for reverting an output signal of the latch unit 60 to generate first and second output signals Sout1 and Sout2 having a dead time.

In this case, the frequency controller 100 of the clock generator controls generation of a clock signal having a predetermined fixed frequency when the ACF operation mode (a first operation mode) is selected by the mode selection unit 5, and controls generation of a soft start signal and a clock signal having a frequency according to the operation current when the LLC operation mode (a second operation mode) is selected by the mode selection unit 5, as described above. And, the current controlling oscillator unit 200 of the clock generator generates a clock signal through the control of the frequency controller 100.

Here, when the LLC operation mode is selected by the mode selection unit 5, the frequency controller 100 controls generation of a clock signal having a gradually decreasing frequency according to the operation current if the soft start signal SS is less than the reference level, and controls generation of a clock signal having a predetermined operation frequency if the soft start signal exceeds the reference level.

Hereinafter, the objects and effects of the present invention will be described in more detail with reference to the accompanying drawings.

Referring to FIGS. 1 to 3, the clock generator according to one exemplary embodiment of the present invention dividedly operates into a first operation mode and a second operation mode, depending on a mode selection signal (MS).

Through the operation as shown in FIG. 3, the frequency controller 100 as shown in FIGS. 2 and 3 determines whether an operation mode is the first operation mode or the second operation mode depending on the mode selection signal (MS), and controls the generation of charging and discharging currents according to the determined operation modes.

An operation of the frequency controller 100 will be described in detail with reference to the FIGS. 2 and 3.

In FIGS. 2 and 3, the mode decision unit 110 of the frequency controller 100 judges whether an operation mode is a first operation mode or a second operation mode, depending on a mode selection signal (S110).

Next, the charging/discharging current controller 120 of the frequency controller 100 controls generation of charging and discharging currents according to the first and second currents when the operation mode is proven to be a first operation mode by the mode decision unit 110, and, when the operation mode is proven to be a second operation mode by the mode decision unit 110, the charging/discharging current controller 120 controls generation of charging and discharging currents on the basis of the third current if the soft start signal SS is proven to be in an initial state (S121), and controls generation of charging and discharging currents on the basis of the fourth current if the soft start signal SS is proven to be in a normal state (S122). This operation is repeatedly carried out until it is finished (S130).

In this case, the first operation mode may be an ACF mode corresponding to an active clamp forward mode belonging to a half bridge type, and the second operation mode may be an LLC mode corresponding to an LLC resonant half bridge mode.

The oscillation controller 220 will be described in detail with reference to the FIG. 4.

In FIG. 4, the oscillation controller 220 includes a first comparator 221, a second comparator 222 and a RS latch 223. Here, the first comparator 221 receives a charge voltage Vct of the capacitor CT through a reverting terminal and receives the highest reference voltage Vref1 through a non-reverting terminal, compares the charge voltage Vct with the highest reference voltage Vref1, and outputs a signal corresponding to the comparison value to a set terminal of the RS latch 223 through an output terminal.

Also, the first comparator 222 receives the charge voltage Vct through the reverting terminal and receives the lowest reference voltage Vref2 through the non-reverting terminal, compares the charge voltage Vct with the lowest reference voltage, and outputs a signal corresponding to the comparison value to a reset terminal of the RS latch 223 through the output terminal.

And, the RS latch 223 receives an output signal of the first comparator 221 through a set terminal and receives an output signal of the second comparator 222 through a reset terminal, and outputs an OFF signal to the switch SW when the output signal of the first comparator 221 is in a low level and outputs an ON signal to the switch SW when the output signal of the second comparator 222 is in a high level.

As described above, a voltage between the highest reference voltage Vref1 and the lowest reference voltage Vref2 may be maintained constantly in the capacitor CT as shown in FIG. 5 since the switch SW performs a switching operation through the control of the oscillation controller 220.

First, the first operation mode (an ACF operation mode) will be described in detail with reference to the FIGS. 6 and 7.

Referring to FIGS. 6 and 7, the frequency controller 100 of the dual mode clock generator according to one exemplary embodiment of the present invention may control generation of a charge current in the current source unit 210 according to the first and second currents I1 and I2 in the first operation mode to charge the capacitor CT, and also control generation a discharge current in the current sink unit 230 to discharge the capacitor CT.

Here, the first current I1 may be a predetermined current that is used to charge the capacitor CT in the first operation mode, and the second current I2 may be a predetermined current that is used to discharge the capacitor CT in the first operation mode.

Referring to FIG. 6, the current source unit 210 generates a charge current (I1×3) according to the first current I1 in the first operation mode through the control of the frequency controller 100. In this case, a voltage is charged in the capacitor CT according to the charge current generated by the current source unit 210 when the switch SW is in an OFF state.

Also, the current sink unit 230 of the dual mode clock generator generates a discharge current according to the second current I2 in the first operation mode through the control of the frequency controller 100.

Furthermore, the oscillation controller 220 of the dual mode clock generator controls switch-on or switch-off to maintain a charge voltage Vct of the capacitor CT between the predetermined highest reference voltage Vref1 and the predetermined lowest reference voltage Vref2.

That is, the oscillation controller 220 controls an OFF state of the switch SW when the charge voltage Vct of the capacitor CT is greater than the predetermined highest reference voltage Vref1, and controls an ON state of the switch SW when the charge voltage Vct is less than the predetermined lowest reference voltage Vref2.

Therefore, the switch SW may be operated in an OFF state through the OFF control of the oscillation controller 220, and thus a voltage is charged in the capacitor CT by the charge current from the current source unit 210.

On the contrary, the switch SW may be operated in an ON state through the ON control of the oscillation controller 220. In this case, the charge voltage Vct charged in the capacitor CT is discharged by the discharge current of the current sink unit 230.

As described above, the dual mode clock generator according to one exemplary embodiment of the present invention controls generation of a charge current (I1×3) in the current source unit 210 on the basis of the first and second currents I1 and I2 in the first operation mode (an ACF operation mode) as shown in FIG. 6, and controls generation of a discharge current (I2×6) in the current sink unit 230.

Also, the oscillation controller 220 controls a frequency of the switch SW to a constant switch SW level according to the first and second reference voltages Vref1 and Vref2 and the charge voltage Vct of the capacitor CT as described above, and therefore generates a clock signal having a constant fixed frequency, as shown in FIG. 7.

Subsequently, the second operation mode will be described in detail with reference to the FIGS. 8 and 9.

Referring to FIGS. 8 and 9, the frequency controller 100 of the dual mode clock generator according to one exemplary embodiment of the present invention may divide an initial state and a normal state according to the soft start signal SS to control generation of charge and discharge currents according to the third current I3 or the fourth current I4 in the second operation mode, thereby to charge the capacitor CT, and also control generation of a discharge current in the current sink unit 230 according to the third current I3 or the fourth current I4 to discharge the capacitor CT.

In particular, the frequency controller 100 controls generation of charging and discharging currents on the basis of the third current I3 when the soft start signal SS is proven to be in an initial state in the second operation mode, and controls generation of charging and discharging currents on the basis of the fourth current I4 when the soft start signal SS is proven to be in a normal state.

Here, the third current I3 may be a predetermined current that is used to charge and discharge the capacitor CT in the initial state in the second operation mode, and the fourth current I4 may be a feed-back current from a load that is used to charge and discharge the capacitor CT in the normal state in the second operation mode.

Referring to FIG. 8 (a), the current source unit 210 recognizes an initial state and a normal state according to the soft start signal SS in the second operation mode and generates a charge current (I3×6) according to the third current or the fourth current in the initial state through the control of the frequency controller 100. In this case, a voltage is charged in the capacitor CT according to the charge current generated by the current source unit 210 when the switch SW is in an OFF state.

Also, the current sink unit 230 of the dual mode clock generator generates a discharge current (I3×6) according to the third current I3 in the initial state in the second operation mode through the control of the frequency controller 100.

In this case, an initially set current in the initial state is "I3×6," and set to a gradually decreasing value with the gradual increase in the soft start signal SS.

Referring to FIG. 8 (b), the current source unit 210 recognizes an initial state and a normal state according to the soft start signal SS in the second operation mode and generates a charge current (I4×3) according to the fourth current I4, being detected from a load, in the normal state through the control of the frequency controller 100. In this case, a voltage is charged in the capacitor CT according to the charge current generated by the current source unit 210 when the switch SW is in an OFF state.

Also, the current sink unit 230 of the dual mode clock generator generates a discharge current (I4×3) according to the third current I3 in the initial state in the second operation mode through the control of the frequency controller 100.

Referring to FIGS. 8 (a) and (b), the oscillation controller 220 controls switch-on or switch-off to maintain the charge voltage Vct of the capacitor CT between the predetermined highest reference voltage and the predetermined lowest reference voltage.

That is, the oscillation controller 220 controls an OFF state of the switch SW when the charge voltage Vct of the capacitor CT is greater than the predetermined highest reference voltage Vref1, and controls an ON state of the switch SW when the charge voltage is less than the lowest reference voltage Vref2 that is set to a lower value than the highest reference voltage Vref1.

Therefore, the switch SW may be operated into an OFF state through the OFF control of the oscillation controller 220, as described above. In this case, a voltage is charged in the capacitor CT by means of the charge current from the current source unit 210.

On the contrary, the switch SW may be operated into an ON state through the control of the oscillation controller 220. In this case, the charge voltage Vct charged in the capacitor CT is discharged by the discharge current of the current sink unit 230.

For the dual mode clock generator according to one exemplary embodiment of the present invention as described above, the frequency controller 100 controls the generation of the charge current (I3×6) in the current source unit 210 on the basis of the third current I3 and controls the generation of the discharge current (I3×6) in the current sink unit 230, as shown in FIG. 8 (a).

Also, the frequency controller 100 controls the generation of the charge current (I4×3) in the current source unit 210 on the basis of the fourth current I4 and controls the generation of the discharge current (I4×3) in the current sink unit 230, as shown in FIG. 8 (b).

In this case, the oscillation controller 220 controls a frequency of the switch SW to a constant frequency level according to the first and second reference voltages Vref1 and Vref2 and the charge voltage Vct of the capacitor CT, as described above. Therefore, the oscillation controller 220 generates a clock signal having a gradually decreasing frequency in the initial state and a clock signal having a constant frequency in the normal state, as shown in FIG. 9.

As described above, the dual mode clock generator according to one exemplary embodiment of the present invention is applicable to the DC-CD converter, as shown in FIG. 10. In this case, the dual mode clock generator generates a clock signal having a predetermined fixed frequency when the ACF operation mode is selected by the mode selection unit 5, and generates the soft start signal SS and a clock signal having a frequency according to the operation current when the LLC operation mode is selected by the mode selection unit 5.

As described above, the present invention is related to a dual mode clock generator that is applicable to the DC-CD converters of the power supply, and more particularly to a dual mode clock generator capable of generating a suitable clock signal for an operation mode that is selected in response to selection of an ACF mode and an LLC mode.

While the present invention has been shown and described in connection with the exemplary embodiments and the accompanying drawings, it will be apparent to those skilled in the art that modifications and variations can be made without departing from the spirit and scope of the invention as defined by the appended claims.

What is claimed is:

1. A dual mode clock generator, comprising:
a frequency controller for controlling generation of charge and discharge currents according to first and second currents in a first operation mode and recognizing an initial state and a normal state according to a soft start signal to control generation of charge and discharge currents according to a third current or a fourth current in a second operation mode;
a current source unit for generating a charge current according the first current in the first operation mode and generating a charge current according to the third current or the fourth current in the second operation mode depending on the initial state and the normal state through the control of the frequency controller;
a capacitor for charging a voltage according to the charge current generated by the current source unit;
an oscillation controller for controlling switch-on or switch-off to maintain a charge voltage of the capacitor between a highest reference voltage and a lowest reference voltage;
a switch coupled between a ground and a connection node formed between the current source unit and the capacitor, and controlling charging and discharging of the capacitor by performing an on/off operation through the ON or OFF control of the oscillation controller; and a current sink unit coupled between the switch and the ground to generate a discharge current according to the second current in the first operation mode and generate a discharge current according to the third current and the fourth current in the second operation mode depending on the initial state and the normal state and to discharge a charge voltage of the capacitor using the discharge currents through the control of the frequency controller;

wherein the frequency controller comprises:

a mode decision unit configured to determine whether an operation mode is a first operation mode or a second operation mode according to a mode selection signal; and a charging/discharging current controller configured to control generation of charging and discharging currents according to the first and second currents when the operation mode is proven to be a first operation mode by the mode decision unit, and controlling generation of charging and discharging currents on the basis of the third current when a soft start signal is proven to be in the initial state in the second operation mode by the mode decision unit, and controlling generation of charging and discharging currents on the basis of the fourth current when the soft start signal is proven to be in the normal state.

2. The dual mode clock generator of claim 1, wherein the frequency controller controls generation of charging and discharging currents on the basis of the third current when a soft start signal is proven to be in the initial state in the second operation mode, and controls generation of charging and discharging currents on the basis of the fourth current when the soft start signal is proven to be in the normal state in the second operation mode.

3. The dual mode clock generator of claim 2, wherein the current source unit generates a charge current according to the third current when the current source is in the initial state in the second operation mode, and generates a charge current according to the fourth current when the current source is in the normal state in the second operation mode.

4. The dual mode clock generator of claim 3, wherein the oscillation controller controls an ON state of the switch when the charge voltage of the capacitor is higher than predetermined highest reference voltage, and controls an OFF state of the switch when the charge voltage of the capacitor is lower than the lowest reference voltage that is set to a lower value than the highest reference voltage.

5. The dual mode clock generator of claim 4, wherein the current sink unit generates a discharge current according to the third current when it is in the initial state in the second operation mode and generates a discharge current according to the fourth current when it is in the normal state in the second operation mode, and discharges a charge voltage of the capacitor using the discharge currents.

6. The dual mode clock generator of claim 5, wherein the first operation mode is an ACF mode corresponding to an active clamp forward mode belonging to a half bridge type.

7. The dual mode clock generator of claim 6, wherein the second operation mode is an LLC mode corresponding to an LLC resonant half bridge mode.

8. The dual mode clock generator of claim 7, wherein the first current is a predetermined current that is used to charge the capacitor in the first operation mode, and wherein the second current is a predetermined current that is used to discharge the capacitor in the first operation mode.

9. The dual mode clock generator of claim 8, wherein the third current is a predetermined current that is used to charge and discharge the capacitor in the initial state in the second operation mode, and wherein the fourth current is a feed-back current from a load that is used to charge and discharge the capacitor in the normal state in the second operation mode.

10. The dual mode clock generator of claim 1, wherein the first current is a predetermined current that is used to charge the capacitor in the first operation mode, and wherein the second current is a predetermined current that is used to discharge the capacitor in the first operation mode.

11. The dual mode clock generator of claim 10, wherein the third current is a predetermined current that is used to charge and discharge the capacitor in the initial state in the second operation mode, and wherein the fourth current is a feed-back current from a load that is used to charge and discharge the capacitor in the normal state in the second operation mode.

12. The dual mode clock generator of claim 1, wherein the oscillation controller comprises:

a first comparator including a reverting terminal for receiving a charge voltage of the capacitor, a non-reverting terminal for receiving the highest reference voltage and an output terminal for comparing the charge voltage with the highest reference voltage and outputting a signal corresponding to the comparison value;

a second comparator including a reverting terminal for receiving the charge voltage, a non-reverting terminal for receiving the lowest reference voltage, and an output terminal for comparing the charge voltage with the lowest reference voltage and outputting a signal corresponding to the comparison value; and a RS latch including a set terminal for receiving an output signal of the first comparator and a reset terminal for receiving an output signal of the second comparator, and outputting an OFF signal to the switch when the output signal of the first comparator is in a low level and outputting an ON signal to the switch when the output signal of the second comparator is in a high level.

* * * * *